US011152433B2

(12) United States Patent
Liu

(10) Patent No.: US 11,152,433 B2
(45) Date of Patent: Oct. 19, 2021

(54) DISPLAY SCREEN AND DISPLAY APPARATUS

(71) Applicant: Kunshan Go-Visionox Opto-Electronics Co., Ltd., Kunshan (CN)

(72) Inventor: Mingxing Liu, Kunshan (CN)

(73) Assignee: KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 9 days.

(21) Appl. No.: 16/666,376

(22) Filed: Oct. 28, 2019

(65) Prior Publication Data
US 2020/0066809 A1 Feb. 27, 2020

Related U.S. Application Data

(63) Continuation of application No. PCT/CN2018/093476, filed on Jun. 28, 2018.

(30) Foreign Application Priority Data

Sep. 30, 2017 (CN) .......................... 201710937430.X
Sep. 30, 2017 (CN) .......................... 201710938216.6
(Continued)

(51) Int. Cl.
*H01L 27/32* (2006.01)
*G09G 3/3225* (2016.01)

(52) U.S. Cl.
CPC ....... *H01L 27/3218* (2013.01); *G09G 3/3225* (2013.01); *H01L 27/326* (2013.01); *H01L 27/3227* (2013.01); *H01L 27/3234* (2013.01)

(58) Field of Classification Search
CPC ............... H01L 27/326; H01L 27/3267; H01L 27/3286
See application file for complete search history.

(56) References Cited

U.S. PATENT DOCUMENTS 9,454,925 B1 9/2016 Grafton et al.
10,304,373 B2 5/2019 Du
(Continued)

FOREIGN PATENT DOCUMENTS

CN 2705844 Y 6/2005
CN 201004298 Y 1/2008
(Continued)

OTHER PUBLICATIONS

Office Action of Chinese Patent Application No. 201810135316X dated Apr. 9, 2020.
(Continued)

*Primary Examiner* — Jae Lee
(74) *Attorney, Agent, or Firm* — Kilpatrick Townsend & Stockton

(57) ABSTRACT

A display screen and a display apparatus. The display screen includes a first region and a second region. The first region has a physical pixel density smaller than that of the second region. By providing a first region and a second region and having a greater physical pixel density in the second region than that in the first region, light can transmit through the gap between the pixels in the first region configured to house the under-screen photosensitive module such as a camera and the like, so as to achieve a high light transmittance and therefore to achieve an entire screen or full screen display. A non-display region above the active display region can be omitted and the screen-to-body ratio is increased, user experience is optimized and thus the technical problem of unfavorable user experience due to the presence of the non-display region is addressed.

12 Claims, 18 Drawing Sheets

(30) Foreign Application Priority Data

| | | | |
|---|---|---|---|
| Sep. 30, 2017 | (CN) | ......................... | 201710938832.1 |
| Feb. 9, 2018 | (CN) | ......................... | 201810135316.X |
| Feb. 9, 2018 | (CN) | ......................... | 201810135319.3 |
| Feb. 9, 2018 | (CN) | ......................... | 201810135642.0 |

(56) References Cited

U.S. PATENT DOCUMENTS

| | | | |
|---|---|---|---|
| 2013/0278488 A1 | 10/2013 | Huo | |
| 2014/0218956 A1 | 8/2014 | Wu | |
| 2015/0076473 A1 | 3/2015 | Miyake | |
| 2016/0196776 A1 | 7/2016 | Yang et al. | |
| 2016/0357076 A1 | 12/2016 | Lujiang et al. | |
| 2017/0317150 A1* | 11/2017 | Chung | ................ H01L 27/3216 |
| 2018/0088260 A1 | 3/2018 | Jin et al. | |
| 2018/0198980 A1* | 7/2018 | Takagi | ................... H04N 5/374 |
| 2018/0307088 A1* | 10/2018 | Liu | ................... G02F 1/133345 |
| 2020/0395418 A1* | 12/2020 | Han | ................... H01L 51/0011 |

FOREIGN PATENT DOCUMENTS

| | | | |
|---|---|---|---|
| CN | 102645779 A | 8/2012 |
| CN | 104157246 A | 11/2014 |
| CN | 104166260 A | 11/2014 |
| CN | 104459987 A | 3/2015 |
| CN | 104597655 A | 5/2015 |
| CN | 105185258 A | 12/2015 |
| CN | 205355055 U | 6/2016 |
| CN | 205844708 U | 12/2016 |
| CN | 106355999 A | 1/2017 |
| CN | 106790836 A | 5/2017 |
| CN | 106875906 A | 6/2017 |
| CN | 106921767 A | 7/2017 |
| CN | 106935615 A | 7/2017 |
| CN | 106935616 A | 7/2017 |
| CN | 207264695 U | 4/2018 |
| CN | 108364967 A | 8/2018 |
| CN | 108461521 A | 8/2018 |
| JP | 2003228040 A | 8/2003 |
| JP | 2010230797 A | 10/2010 |
| TW | 200802221 A | 1/2008 |
| TW | 200829985 A | 7/2008 |
| TW | 201505171 A | 2/2015 |
| TW | 201517002 A | 5/2015 |
| WO | 2019062158 A1 | 4/2019 |

OTHER PUBLICATIONS

Office Action of Chinese Patent Application No. 2018101356420 dated Mar. 18, 2020.

International Search Report dated Aug. 24, 2018 in the corresponding International application (application No. PCT/CN2018/093476).

CN First Office Action with search report dated Mar. 21, 2019 in the corresponding CN application (application No. 201810135319.3).

TW First Office Action with search report dated Apr. 19, 2019 in the corresponding TW application (application No. 107126525).

TW Second Office Action dated Apr. 19, 2019 in the corresponding TW application (application No. 107126525).

* cited by examiner

DISPLAY SCREEN AND DISPLAY APPARATUS

CROSS-REFERENCES TO RELATED APPLICATIONS

This application is a continuation application of PCT Patent Application No. PCT/CN2018/093476, entitled "DISPLAY SCREEN, DRIVING METHOD OF DISPLAY SCREEN, AND DISPLAY APPARATUS", filed on Jun. 28, 2018, which claims priority to following Chinese Patent Applications: Chinese Patent Application No. 201710938216.6, entitled "DISPLAY SCREEN AND DISPLAY APPARATUS" filed on Sep. 30, 2017; Chinese Patent Application No. 201710937430. X, entitled "DISPLAY SCREEN AND DISPLAY APPARATUS" filed on Sep. 30, 2017; Chinese Patent Application No. 201710938832.1, entitled "DISPLAY SCREEN, DRIVING METHOD OF DISPLAY SCREEN, AND DISPLAY APPARATUS" filed on Sep. 30, 2017; Chinese Patent Application No. 201810135642.0, entitled "DISPLAY SCREEN AND DISPLAY APPARATUS" filed on Feb. 9, 2018; Chinese Patent Application No. 201810135319.3, entitled "DISPLAY SCREEN AND DISPLAY APPARATUS" filed on Feb. 9, 2018; and Chinese Patent Application No. 201810135316. X, entitled "DISPLAY SCREEN, DRIVING METHOD OF DISPLAY SCREEN, AND DISPLAY APPARATUS" filed on Feb. 9, 2018; the contents of the above identified applications are incorporated by reference herein in their entireties.

TECHNICAL FIELD

The present disclosure relates to the technical field of display.

BACKGROUND

In the conventional art, a display screen includes an active display region and a non-display region located above the active display region. For a smart phone with touch control function, the effective display region can be configured to display a human-machine interface and operate an application provided by the human-machine interface. For example, a video played by the video playback application of the smartphone is displayed in the active display region. However, the presence of the non-display region results in a unfavorable user experience.

SUMMARY

Accordingly, it is necessary to provide a technical solution in view of the technical problem of unfavorable user experience due to the presence of the non-display region.

A display screen includes a first region and a second region, the first region has a physical pixel density smaller than that of the second region.

In an embodiment, the first region has a light-emitting unit different from a light-emitting unit of the second region; the light-emitting unit in the first region includes at least a first sub-pixel, at least a second sub-pixel, and at least a third sub-pixel; a number of at least one sub-pixel of the first sub-pixel, the second sub-pixel, and the third sub-pixel is different from the numbers of the other two sub-pixels.

In an embodiment, the first region has one or more light-emitting units; and the second region has one or more light-emitting units.

In an embodiment, the first region is distributed with a plurality of first-type light-emitting units; and the first-type light-emitting units are arranged in a shape of a pair of triangles sharing a common side.

In an embodiment, the first-type light-emitting unit includes one of the first sub-pixel, two of the second sub-pixels, one of the third sub-pixel, in the first-type light-emitting unit, the first sub-pixel is a red sub-pixel, the second sub-pixel is a green sub-pixel, the third sub-pixel is a blue sub-pixel, the one red sub-pixel and the one blue sub-pixel respectively located at a pair of vertexes of the common side of the pair of triangles, and the two green sub-pixels are respectively located at remaining vertices of the pair of triangles, with respect to the sub-pixels arranged in the first region, in a lateral direction, the red sub-pixels, the green sub-pixels, and the blue sub-pixels are arranged in rows respectively and the colors of adjacent rows are different; and in a longitudinal direction, the green sub-pixels are arranged in a plurality of column groups, each of the column groups includes two columns, and the red and blue sub-pixels are distributed in an alternating manner between each of the column groups, and the column groups are directly adjacent to each other.

In an embodiment, the first region is distributed with second-type light-emitting units; and the second-type light-emitting units are distributed in a shape of a pair of triangles having a common vertex.

In an embodiment, the second-type light-emitting unit includes one of the first sub-pixel, two of the second sub-pixels, two of the third sub-pixel, in the second-type light-emitting unit, the first sub-pixel is a red sub-pixel, the second sub-pixel is a green sub-pixel, the third sub-pixel is a blue sub-pixel, the one red sub-pixel is located at the common vertex of the pair of triangles, and the two green sub-pixels and the two blue sub-pixels are respectively located at remaining vertices of the pair of triangles, the respective vertices of each of the triangles demonstrates different sub-pixels.

With respect to the sub-pixels arranged in the first region, in a lateral direction, the blue sub-pixels are arranged in a plurality of row groups, each of the plurality of row groups has two rows between a row of red sub-pixel and a row of green sub-pixels, and a distance between adjacent row groups is greater than a distance between the row of red sub-pixels and the row of green sub-pixels; and in a longitudinal direction, a plurality of identical column groups are arranged, each of the column groups includes a first column in GBGB form, a second column in BRBR form, and a third column being distributed with only green sub-pixels, and a distance between the adjacent column groups is greater than a distance between pixel columns within one of the plurality of column group.

In an embodiment, the light-emitting unit distributed in the second region includes a red sub-pixel, a green sub-pixel, and a blue sub-pixel.

According to another aspect of the disclosure, a display screen is provided, including a first region and a second region, and the first region has a smaller pixel unit density than the second region.

In an embodiment, the first region has minimum repeating units including one pixel unit and one first blank region, and the first blank region is capable of carrying one pixel unit.

In an embodiment, the first region has minimum repeating units including two pixel units and one second blank region, and the second blank region is capable of carrying two pixel units.

In an embodiment, the minimum repeating units distributed in two adjacent rows or columns are misaligned.

In an embodiment, the pixel unit in the first region includes two red sub-pixels, two green sub-pixels, and two blue sub-pixels, in a longitudinal direction, the sub-pixels in the first region as a whole are arranged as a plurality of identical column groups, each of the plurality of column groups includes a first column in a BRG unit repeating form and a second column in an RGB unit repeating form, a longitudinal distance between adjacent BRG units in the first column is greater than a longitudinal distance between the sub-pixels within the BRG unit, a longitudinal distance between adjacent RGB units in the second column is greater than a longitudinal distance between the sub-pixels within the RGB units, and a distance between adjacent column groups is greater than a distance between pixel columns within one of the plurality of column group; and the pixel unit in the second region includes one red sub-pixel, one green sub-pixel, and one blue sub-pixel.

According to another aspect of the disclosure, a method of driving a display screen is provided, including:

receiving a driving signal;

determining whether a sub-pixel correspondingly driven by the driving signal is in a first region or a second region of the display screen, and the first region has a physical pixel density smaller than that of the second region;

modifying the driving signal according to a preset manner when the sub-pixel correspondingly driven by the driving signal is in the first region;

driving the sub-pixel by using a modified driving signal; and driving the sub-pixel by using the driving signal when the sub-pixel correspondingly driven by the driving signal is in the second region.

In an embodiment, the driving signal is modified by an arithmetic average or a weighted average.

According to another aspect of the disclosure, a display apparatus is provided, including:

a display screen includes a first region and a second region, and the first region has a physical pixel density smaller than that of the second region; and an under-screen photosensitive module sensing light coming through the first region of the display screen.

In an embodiment, the under-screen photosensitive module includes at least one of a photoelectric sensor and a front-facing camera.

In an embodiment, the under-screen photosensitive module is embedded in a depth ranging from 4 mm to 6 mm under the display screen.

The technical solution provided herein has at least the following technical benefits:

By providing a first region and a second region and having a greater physical pixel density in the second region than that in the first region, light can transmit through the gap between the pixels in the first region configured to house the under-screen photosensitive module such as a camera and the like, so as to achieve a high light transmittance and therefore to achieve an entire screen or full screen display, satisfying both the normal display requirement of the camera and requirement of maintaining a high light transmittance at a position housing the under-screen photosensitive module such as the camera and the like. Since it is not necessary to reserve a space for an under-screen photosensitive module such as a front-facing camera and the like, a non-display region above the active display region can be omitted and the screen-to-body ratio is increased, user experience is optimized and thus the technical problem of unfavorable user experience due to the presence of the non-display region is addressed.

BRIEF DESCRIPTION OF THE DRAWINGS

In order to illustrate the technical solutions according to the embodiments of the present disclosure more clearly, the accompanying drawings for describing the embodiments are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE INVENTION

The present disclosure will be described in details in combination with the accompanying drawings and embodiments such that the purpose, technical solution and advantages of the present disclosure will be more apparent. The particular embodiments are described for the purpose of illustrating as opposed to restricting the present disclosure.

Figure 1:
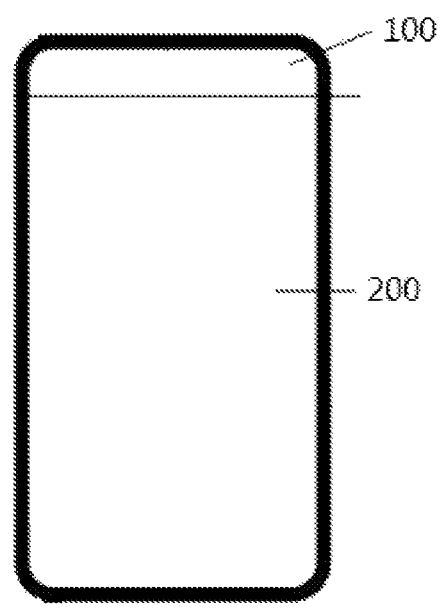
FIG. 1 is a structural schematic diagram of a display screen provided in the present disclosure.

A display screen, as shown in FIG. 1, includes a first region 100 and a second region 200, the first region 100 has a physical pixel density smaller than that of the second region 200.

In particular application, the first region 100 is typically configured to set an under-screen photosensitive module, such as a camera configured to take pictures, and a photoelectric sensor configured to sense whether a human face is close to a display screen. In specific application, the second region 200 may be generally configured to display an image or implement a touch control function. The second region 200 is mainly functionally embodied as a main display region having a relatively high physical pixel density with respect to the first region 100. The physical pixel density refers to the number of physical pixels actually prepared per unit area, not the number of pixels participating in display per unit area. The first region 100 is mainly functionally embodied as an auxiliary display region, and has a relatively low physical pixel density with respect to the second region 200. The first region 100 is also functionally embodied to allow light to pass through and into the display screen to meet requirement on light intensity or light receiving volume of the under-screen photosensitive module. Thus, in the embodiment, the physical pixel density in the first region 100 is less than the physical pixel density in the second region 200 so that light passes through and into the display screen.

The embodiment provided by the present disclosure has at least the effect that, since the first region 100 has a relatively low physical pixel density, an under-screen photosensitive module, such as a camera and the like, may be disposed below the first region 100, so that light can transmit through a gap between sub-pixels to achieve a higher light transmittance while implementing entire screen or full screen display.

In some embodiments, a particular implementation method may include defining an opening by a pixel defining layer (PDL) layer to deposit sub-pixels, and then vapor-depositing the sub-pixels at the opening defined by the PDL layer by using a vapor-deposition process. The sub-pixels formed by the vapor-deposition are physical pixels, and the sub-pixel density in the first region 100 is smaller than the sub-pixel density in the second region 200. Therefore, the described physical pixel density may also be referred as a sub-pixel density.

In the embodiment shown in FIG. 1, the second region 200 serves as the main display region of the display screen, occupying most of the area of the display screen. The first region 100 serves as the auxiliary region of the display screen, and is distributed on the upper side of the display screen. The first region 100 and the second region 200 together form the entire display region of the display screen. In the embodiment shown in FIG. 1, the first region 100 and the second region 200 are located at opposite ends of the display screen. That is, the display screen includes a first end and a second end oppositely disposed, the first region 100 is disposed at the first end of the display screen and the second region 200 is disposed at the second end of the display screen. The first region 100 and the second region 200 are disposed along a length direction of a terminal. In other embodiments, the first region 100 and the second region 200 may also be disposed along a width direction of the terminal. The positional relationship between the first region 100 and the second region 200 may be adjusted according to the actual situation. For example, the first region 100 may be located at a left, right, or lower side of the second region 200. Alternatively, the first region 100 is distributed around the second region 200, enclosing the second region 200 in the middle of the display screen. To the extent two regions that relatively differ in light intensity requirement are present in the display screen, it should be understood as within the substantial protection scope of the present disclosure.

In the disclosure, the first region 100 and the second region 200 are formed on the display screen of a mobile phone by controlling the physical pixel density. Both the first region 100 and the second region 200 can be configured to display images, that is, if the entire display screen is viewed with naked eyes, the entire display screen can display, in other words, a so-called full screen is achieved. Since it is not necessary to reserve a space for an under-screen photosensitive module such as a camera and the like, a non-display region above the active display region can be omitted and the screen-to-body ratio is increased, user experience is optimized and thus the technical problem of unfavorable user experience due to the presence of the non-display region is addressed. Moreover, since the first region 100 has a relatively low physical pixel density, the light intensity requirement of the under-screen photosensitive module, such as the camera of the mobile phone, can be satisfied.

In an embodiment, the first region has a different light-emitting unit from a light-emitting unit in the second region. The light-emitting unit in the first region may be composed of a first sub-pixel, a second sub-pixel, and a third sub-pixel having different light emission colors from each other; the number of at least one sub-pixel of the first sub-pixel, the second sub-pixel, and the third sub-pixel is different from the numbers of the other two sub-pixels. In an embodiment, the first sub-pixel, the second sub-pixel, and the third sub-pixel are a red sub-pixel (R), a green sub-pixel (G), and a blue sub-pixel (B), respectively. At this time, the light-emitting unit distributed in the first region 100 includes a red sub-pixel, a green sub-pixel, and a blue sub-pixel, and the number of at least one sub-pixel of the red sub-pixel, the green sub-pixel, and the blue sub-pixel is different from the numbers of the other two sub-pixels. Therefore, by providing a different number of at least one of the red sub-pixel, the green sub-pixel, and the blue sub-pixel from the numbers of the other two sub-pixels, at least one of the red sub-pixel, the green sub-pixel, and the blue sub-pixel can be shared to achieve white balance while providing a gap through which light is transmitted.

In the embodiment provided by the present disclosure, no modification have to be made on the basis of the main display region of a conventional display screen, i.e., the second region 200 being unmodified; but the sub-pixels of the auxiliary display region of the conventional display screen are modified, i.e., the sub-pixels in the first region 100 being modified, such that the light-emitting unit in the first region 100 is different from the light-emitting unit in the second region 200, and light can transmit through the gap between sub-pixels in the first region to achieve high light transmittance and therefore to achieve an entire screen or full screen display, without affecting the operation of the under-screen photosensitive module.

In an embodiment, one or more light-emitting units are arranged in the first region 100, and one or more light-emitting units are arranged in the second region 200.

An active matrix organic light-emitting diode (AMOLED) is a display technique including depositing or integrating organic light-emitting diode (OLED) pixels on a TFT array, controlling the magnitude of current flowing into each of the OLED pixels by the TFT array, and thus determining light-emitting intensity of each pixel. In the embodiments provided herein, a same driven algorithm may be used to control the light-emission of the light-emitting units arranged in the first region 100 and the light-emitting units arranged in the second region 200. Alternatively, a different driven algorithm may be used to control the light-emission of the light-emitting units arranged in the first region 100 and the light-emitting units arranged in the second region 200.

In application, for example, for a display screen of a mobile phone, the displaying portion of a conventional display screen of the mobile phone may not be changed, whereas a plurality of light-emitting units in the first region 100 are arranged at a position where the under-screen photosensitive module, such as a front-facing camera and the like, is located on the conventional display screen of the mobile phone. Since a certain light intensity or light receiving volume is needed for the under-screen photosensitive module, such as front-facing camera and the like, to achieve a good shooting effect, the above arrangement has the following advantage: when the photosensitive module such as the front-facing camera is arranged behind the layered structure of the display screen, the light-emitting unit in the first region 100 is arranged correspondingly at a position where the front-facing camera is arranged, at least one of the red sub-pixel, the green sub-pixel, and the blue sub-pixel can be shared to achieve white balance while providing a gap through which light is transmitted, so that light intensity or the light receiving volume of the under-screen photosensitive module such as a camera and the like can be satisfied.

Figure 2A:
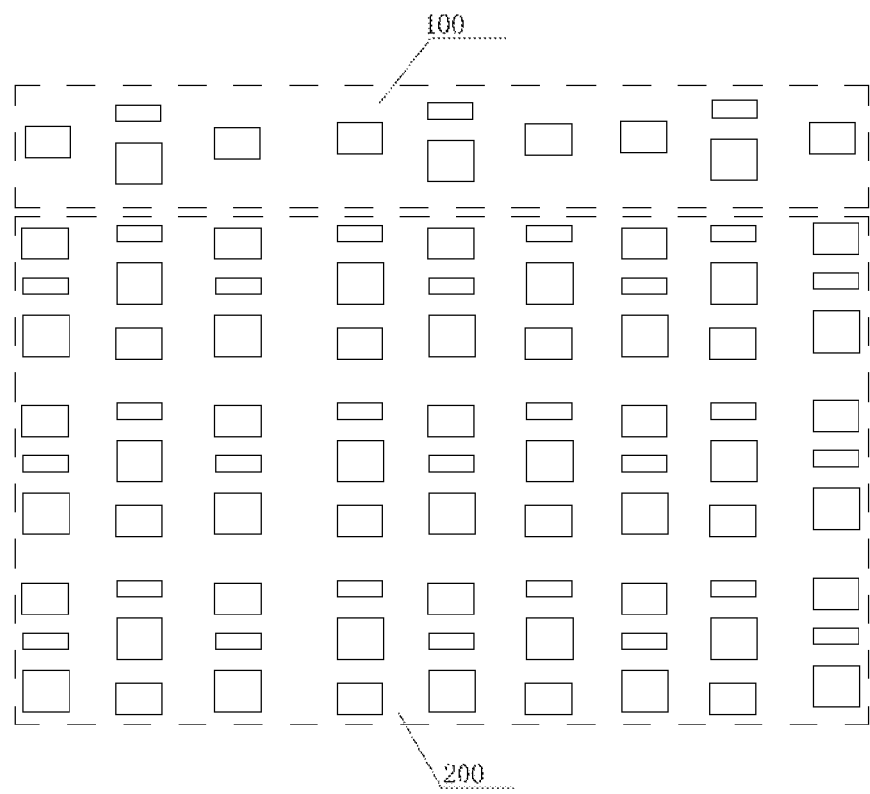
FIG. 2A is a partial structural schematic diagram of a display screen provided in the present disclosure.
Figure 2B:
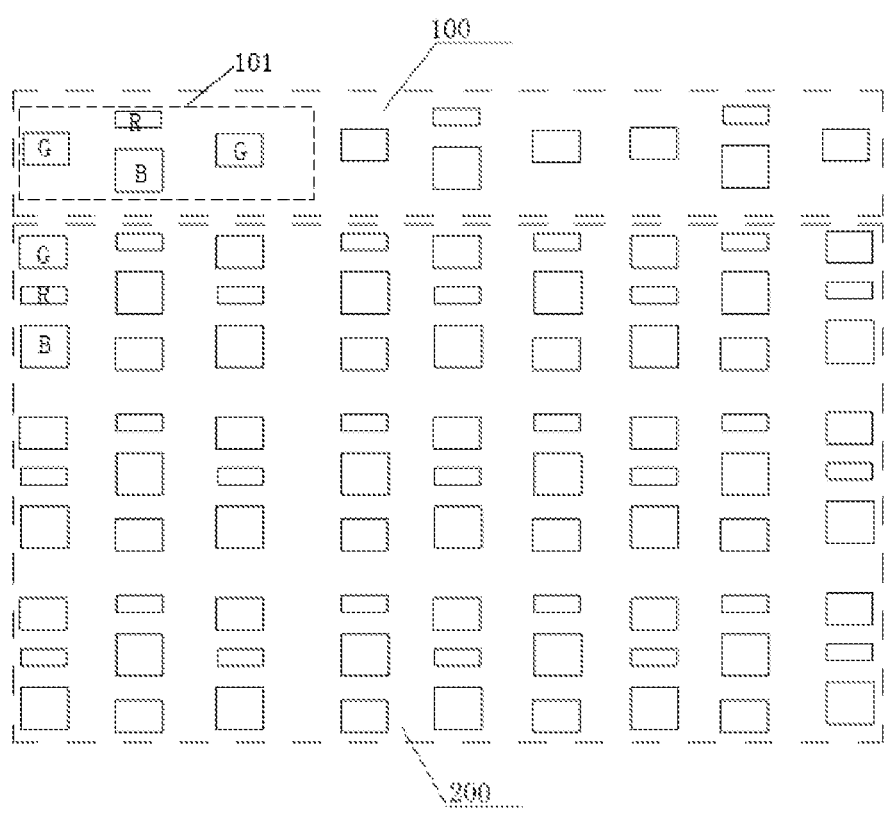
FIG. 2B is a partial structural schematic diagram of a display screen provided in the present disclosure.
Figure 3:
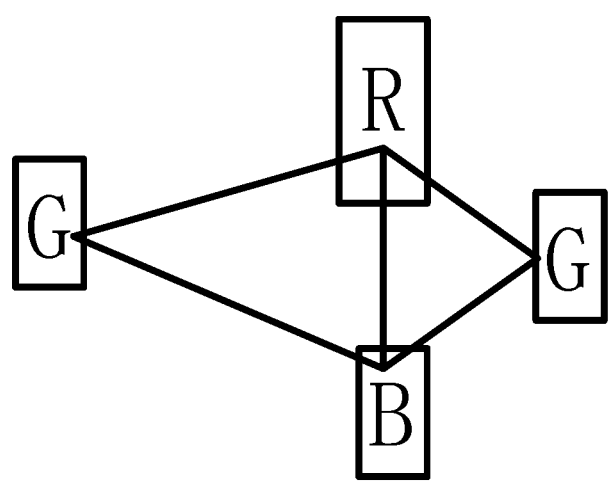
FIG. 3 is a structural schematic diagram of a first-type light-emitting unit in a first region of the display screen provided in FIGS. 2A and 2B.

Referring to FIGS. 2A, 2B and 3, the first region 100 may be provided with a first-type light-emitting unit 101 (or a minimum repeating unit). The first-type light-emitting unit 101 may include one first sub-pixel, two second sub-pixels, and one third sub-pixel.

For example, the first sub-pixel, the second sub-pixel, and the third sub-pixel are a red sub-pixel (R), a green sub-pixel (G), and a blue sub-pixel (B), respectively.

In an embodiment, the first-type light-emitting unit 101 is in a shape of a pair of triangles having a common side (as shown in FIG. 3). As an example, the first sub-pixel, the second sub-pixel, and the third sub-pixel are respectively a red sub-pixel (R), a green sub-pixel (G), and a blue sub-pixel (B); that is, a line connecting one red sub-pixel (R) and one blue sub-pixel (B) forms the common side of the pair of triangles, and the two green sub-pixels (G) are respectively located at remaining vertices of the pair of triangles. As a whole, with respect to the sub-pixels arranged in the first region 100 in a lateral direction, the red sub-pixels, the green sub-pixels, and the blue sub-pixels are each arranged in a row and the colors of adjacent rows are different; in a longitudinal direction, the green sub-pixels are arranged in a plurality of column groups, each of the column groups includes two columns, red and blue sub-pixels are distributed in an alternating manner between each of the respective column groups, and the column groups are directly adjacent to each other; in other words, there are no red sub-pixels and blue sub-pixels between adjacent column groups.

The organic light emitting diode (OLED) relies on a light-emitting material to emit light. Light-emitting materials of different colors have different decay rates. In general, the red light-emitting material has the slowest decay rate and the longest light-emitting lifetime among the light-emitting materials of three colors. In addition, the green light is the most sensitive color for human eyes among red light, green light and blue light, and therefore, reduced number of green sub-pixels may be easily sensed by human eyes. Accordingly, in the present disclosure the red sub-pixels and the blue sub-pixels function as common pixels, so that the visual perception of the human eye will not be affected by the common pixels, and the light emission lifetimes of respective color sub-pixels are balanced.

Furthermore, as shown in FIGS. 2A, 2B and 3, for example, the first sub-pixel, the second sub-pixel, and the third sub-pixel are respectively a red sub-pixel (R), a green sub-pixel (G), and a blue sub-pixel (B). The arrangement of sub-pixels distributed in the second region 200 may be as following: a first column of sub-pixels are arranged in a GRB form, a second column of sub-pixels are arranged in a RBG form, and the blue sub-pixel B is shared by the adjacent red sub-pixel R and the green sub-pixel G.

It will be appreciated that only the most common red, green, and blue sub-pixels are illustrated herein, and the red, green, and blue sub-pixels may also be replaced by sub-pixels of other colors.

Figure 4A:
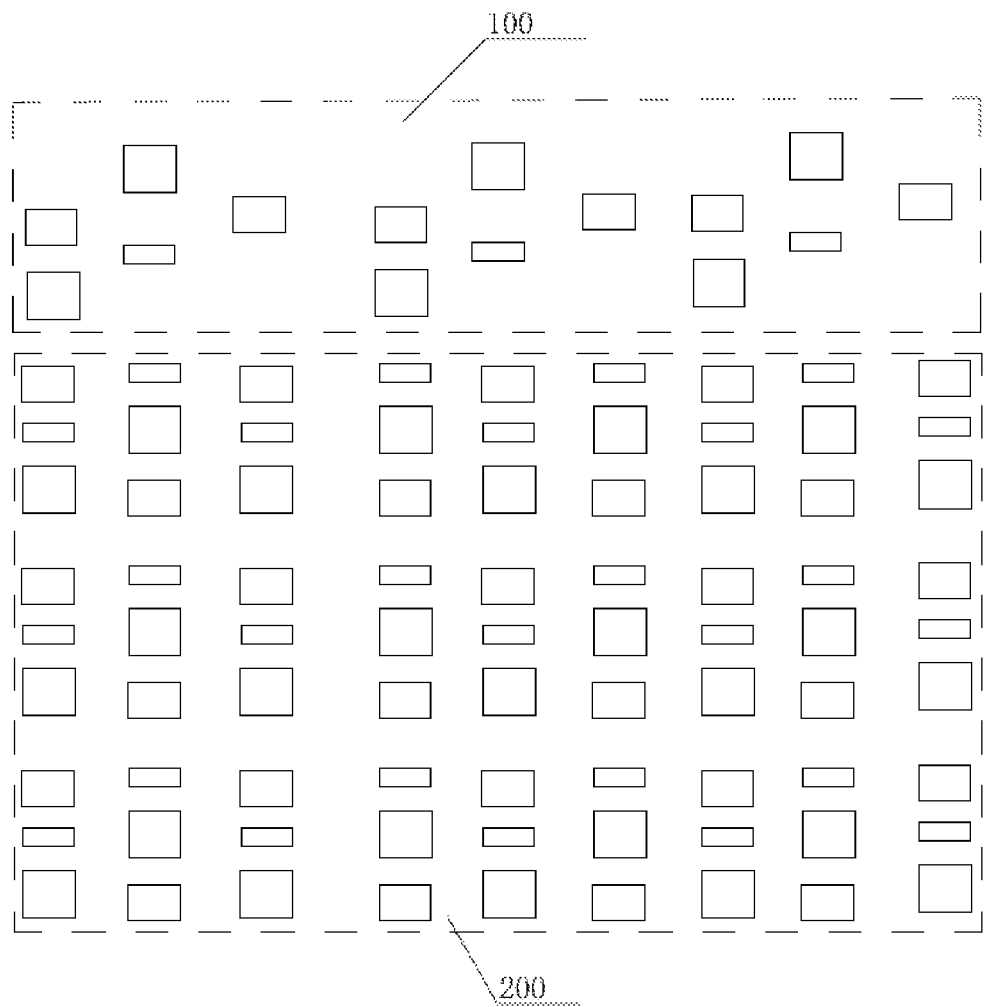
FIG. 4A is a partial structural schematic diagram of another display screen provided in the present disclosure.
Figure 4B:
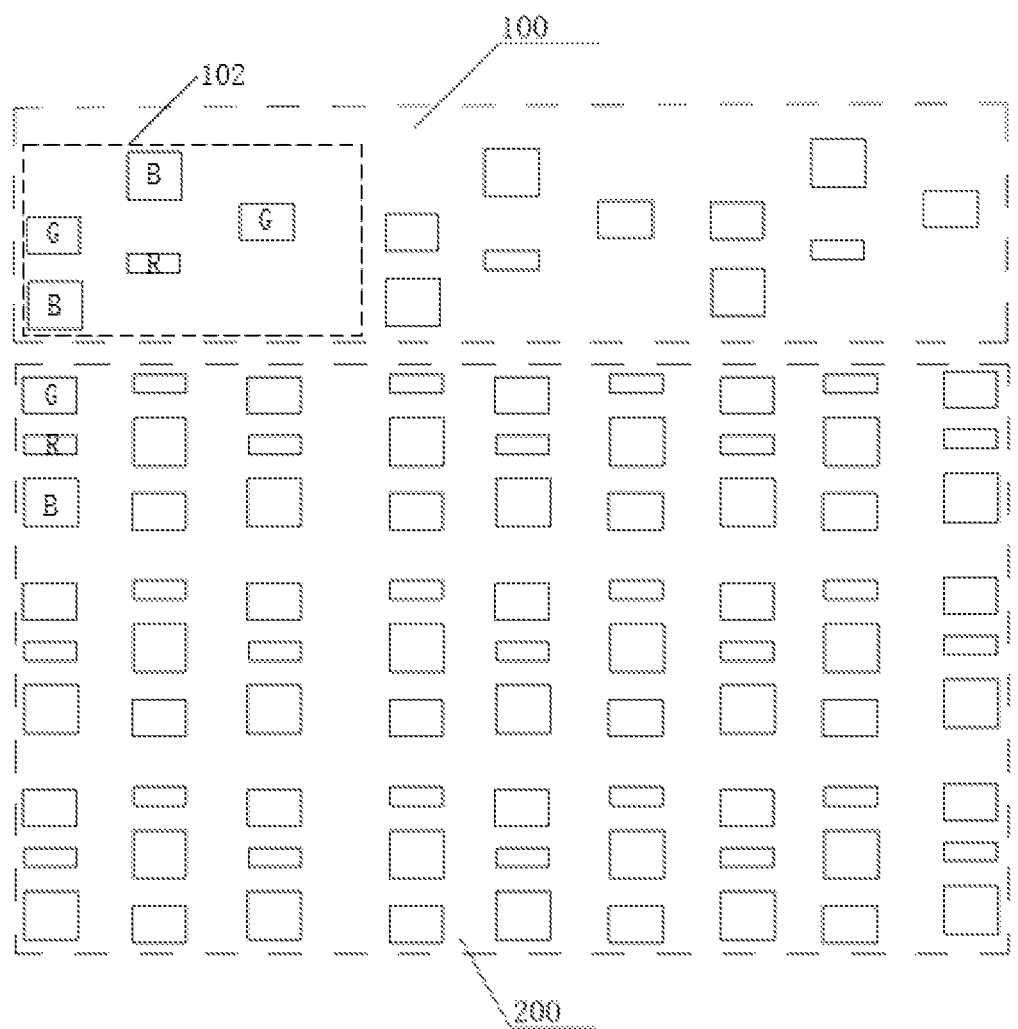
FIG. 4B is a partial structural schematic diagram of another display screen provided in the present disclosure.
Figure 4C:
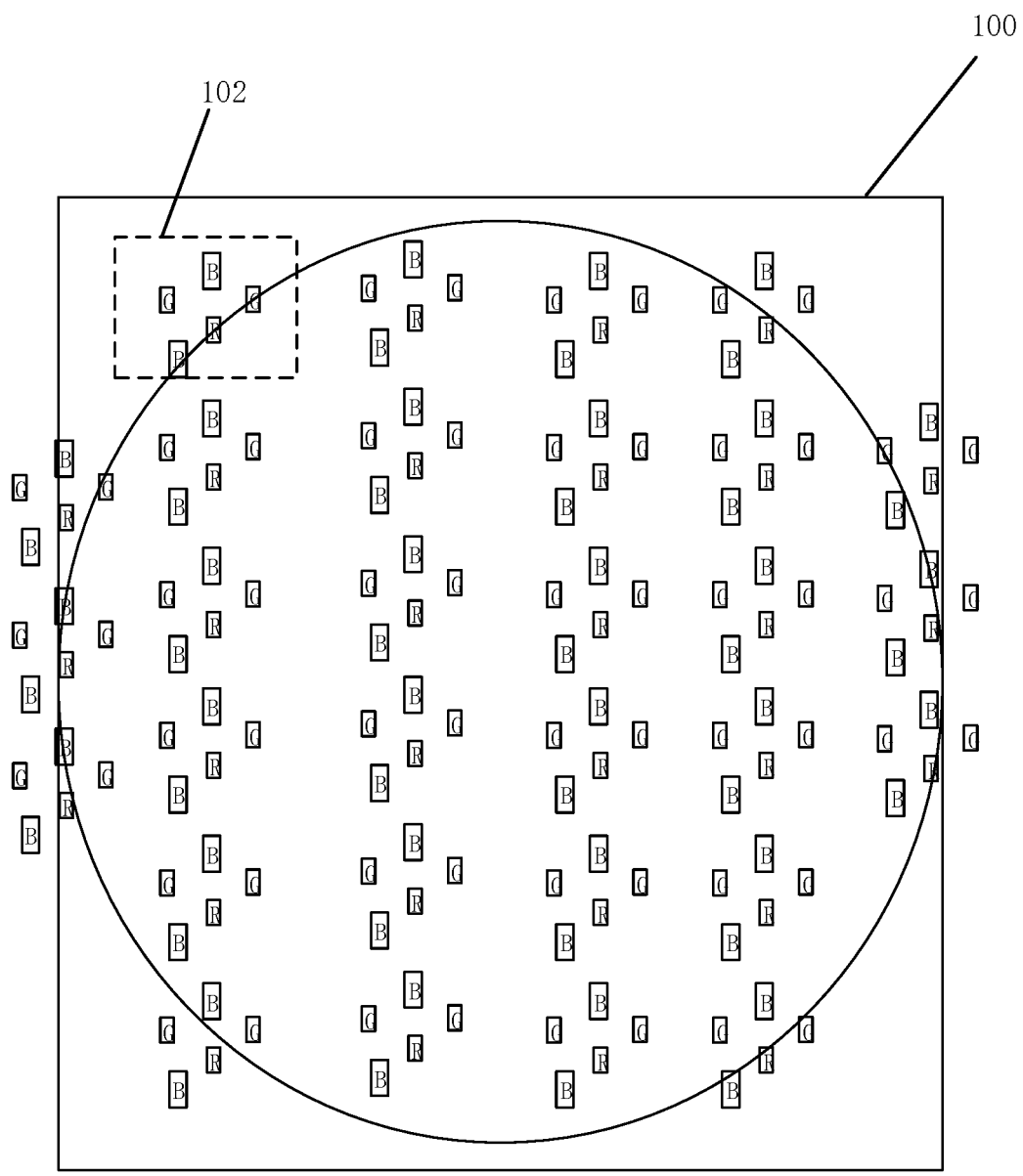
FIG. 4C is a partial enlarged schematic diagram of a first region 100 of the display screen shown in FIGS. 4A and 4B.

As shown in FIGS. 4A, 4B, 4C and 5, a second-type light-emitting unit 102 may be disposed in the first region 100. FIG. 4C is a partial enlarged schematic diagram of the first region 100, which shows the arrangement of the second-type light-emitting units 102 in the first region 100 as a whole. The second-type light-emitting units 102 are distributed in the shape of a pair of triangles having a common vertex.

As an example, the first sub-pixel, the second sub-pixel, and the third sub-pixel are respectively a red sub-pixel (R), a green sub-pixel (G), and a blue sub-pixel (B), as shown in FIGS. 4A, 4B, 4C, and 5, the second-type light-emitting unit 102 includes one red sub-pixel, two green sub-pixels, and two blue sub-pixels, the one red sub-pixel is located at a common vertex of a pair of triangles, the two green sub-pixels and the two blue sub-pixels are respectively located at the remaining vertices of the pair of triangles such that the respective vertices of each of the triangles demonstrates different sub-pixels.

As a whole, with respect to the sub-pixels arranged in the first region 100, in the lateral direction, the blue sub-pixels are arranged in a plurality of row groups, each of the row groups has two rows, between which a red sub-pixel row and a green sub-pixels row are distributed, and a distance between adjacent row groups is greater than a distance between a red sub-pixel row and a green sub-pixel row; and in the longitudinal direction, a plurality of identical column groups are arranged, and each of the column groups includes a first column in the form of GBGB (green sub-pixels are alternated with blue sub-pixels), a second column in the form of BRBR (blue sub-pixels are alternated with red sub-pixels), and a third column being distributed with only green sub-pixels. The distance between adjacent column groups is greater than the distance between pixel columns within a column group. Since only the red sub-pixel is used as the common pixel, the light emission lifetime of the color sub-pixels can be balanced while reducing the pixel density.

As shown in FIGS. 4A, 4B, and 4C, as an example, the first sub-pixel, the second sub-pixel, and the third sub-pixel are respectively a red sub-pixel (R), a green sub-pixel (G), and a blue sub-pixel (B), the arrangement of sub-pixels distributed in the second region 200 may be as following: the first column of sub-pixels are arranged in a GRB form, the second column of sub-pixels are arranged in a RBG form, and the blue sub-pixel B is shared by the adjacent red sub-pixel R and the green sub-pixel G.

It will be appreciated that only the most common red, green, and blue sub-pixels are taken as an example, the red, green, and blue sub-pixels may also be replaced by sub-pixels of other colors.

Figure 5:
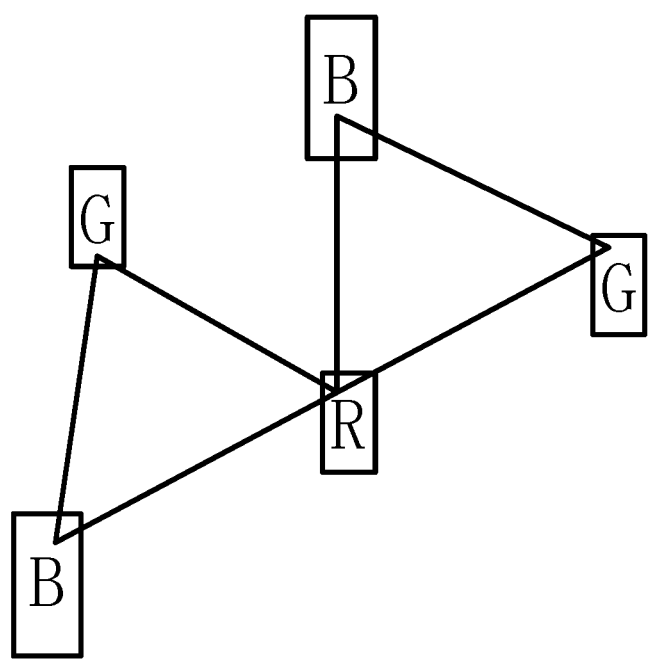
FIG. 5 is a structural schematic diagram of a first-type light-emitting unit in a first region of the display screen provided in FIGS. 4A, 4B, and 4C.

The sub-pixel arrangement in the light-emitting units arranged in the second region 200 may be adapted as needed, for example, the first-type light-emitting units shown in FIG. 3 are arranged in the first region 100, and the second-type light-emitting units shown in FIG. 5 are arranged in the second region 200. Obviously, in the second region 200, an ordinary light-emitting unit, such as a light-emitting unit having the same numbers of red sub-pixels, green sub-pixels, and blue sub-pixels, may also be used.

Referring to FIGS. 2A, 2B, 4A, 4B, and 4C, a gap for transmitting light is provided while achieve white balance by sharing the red sub-pixel and the blue sub-pixel, and by sharing the red sub-pixel, respectively, and thus requirement on the light intensity or the light receiving volume of the under-screen photosensitive module can be satisfied. It can be understood that any technical solution that provides a gap for transmitting light while achieving white balance by sharing the sub-pixels to meet the requirement on the light intensity or the light receiving volume of the under-screen photosensitive module shall be considered within the essential protection scope of this application.

In the embodiment provided herein, the sub-pixels in the first region 100 are reduced by pixel sharing without affecting the resolution ratio (Pixels Per Inch, PPI) thereof, so as to reduce the affection on the display.

In the embodiment shown in FIGS. 2A and 2B, by arranging the pixels in the first region 100 in a manner of common-sided triangles, 2 sub-pixels are reduced in every two light-emitting units, and therefore the light transmittance is increased by at least 50% or more; meanwhile, the density of the light-emitting unit is the same as that in the second region 200, and therefore, the PPI thereof is not affected.

In the embodiment shown in FIGS. 4A and 4B, the sub-pixels of the second type light-emitting unit 102 are distributed in a shape of a pair of triangles having a common vertex. One sub-pixel is reduced in every two light-emitting units, and therefore the light transmittance is increased by at least 20% or more; and the density of the light-emitting units is the same as that in the second region 200, and therefore, the PPI thereof is not affected.

In an embodiment provided herein, the second region may also be provided with a third-type light-emitting unit. The third-type light-emitting unit includes a first sub-pixel, a second sub-pixel, and a third sub-pixel; the sub-pixels of the third-type light-emitting unit are distributed in the shape of a triangle. The third-type light-emitting units in the second region may be distributed in a shape of a triangle with three sub-pixels alternating with each other. In an embodiment, the first sub-pixel, the second sub-pixel, and the third sub-pixel are red, green, and blue sub-pixel, respectively. The first sub-pixel, the second sub-pixel, and the third sub-pixel may emit color light of different colors, for example, the three colors of red (R), green (G), and blue (B). The color lights emitted by the three sub-pixels are different from each other.

In an embodiment, the pixel unit density in the first region is smaller than the pixel unit density in the second region.

Referring to FIGS. 6A to 8, a display screen includes a first region 100 and a second region 200. The pixel unit density in the first region 100 is smaller than that in the second region 200.

In one particular application of a display screen, such as a mobile phone display screen, which conventionally may include a first region 100 in which a camera is provided and a second region 200 mainly for displaying an image. In the present disclosure, a first region 100 and a second region 200 are formed on a display screen of the mobile phone, and both the first region 100 and the second region 200 can be configured to display an image; that is, the entire display screen, when is viewed by a naked eye, is displayable, i.e., a so-called full screen. Since the pixel density in the first region 100 is smaller than that in the second region 200, the light intensity requirement of the under-screen photosensitive module such as the front-facing camera of the mobile phone can be satisfied, so that no position is reserved for the front-facing camera; therefore, a non-display region above the effective display region may be omitted, the screen-to-body ratio may be increased, and the user experience may be optimized, so that the technical problem of unfavorable user experience due to the presence of the non-display region may be addressed.

Figure 6A:
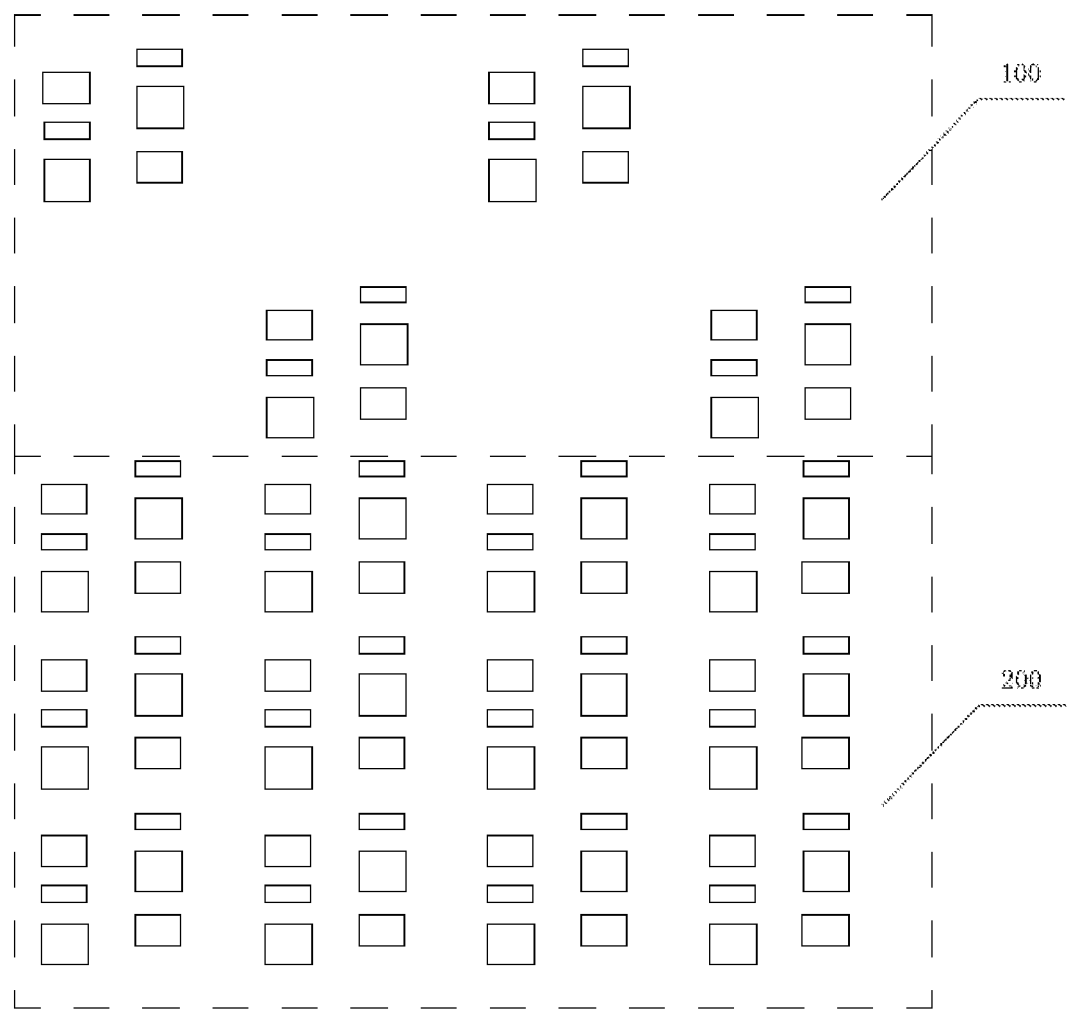
FIG. 6A is a structural schematic diagram of a first arrangement of sub-pixels of the display screen according to an embodiment of the present disclosure.
Figure 6B:
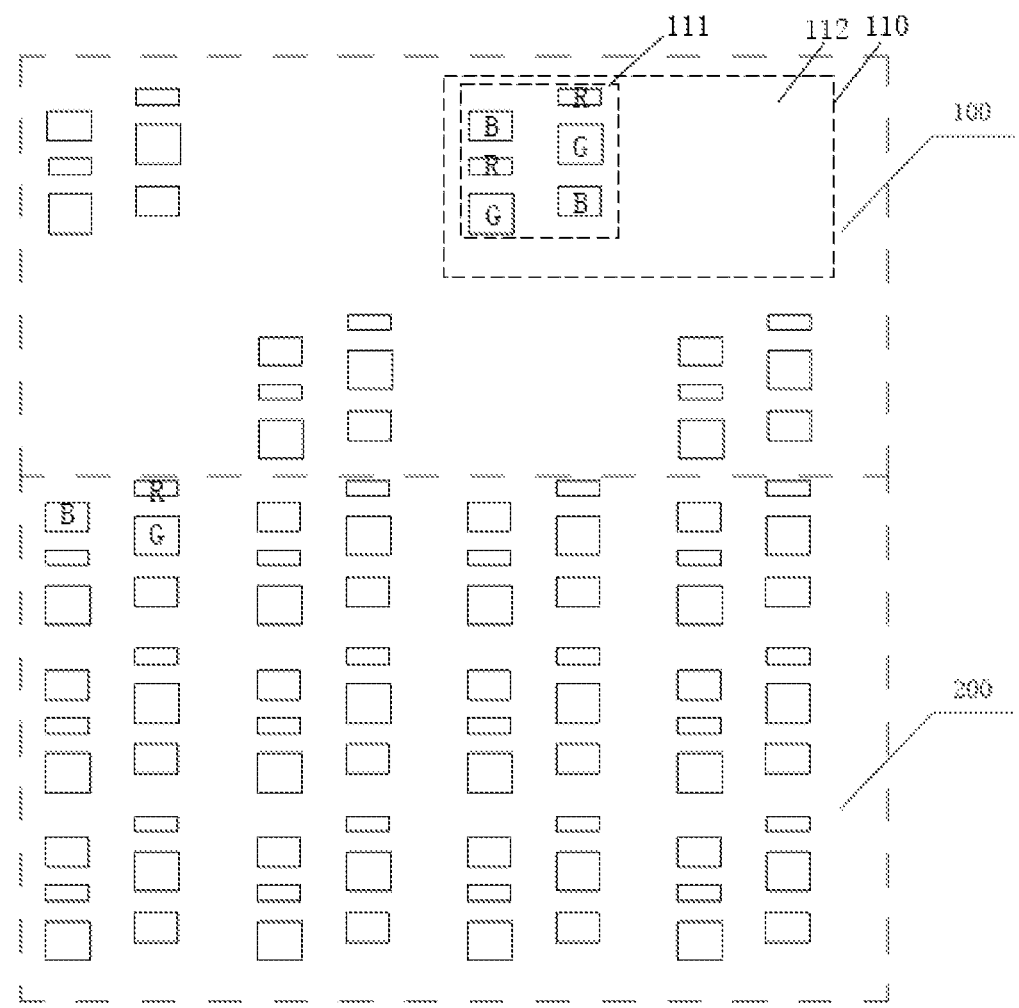
FIG. 6B is a structural schematic diagram of a first arrangement of sub-pixels of the display screen according to an embodiment of the present disclosure.
Figure 6C:
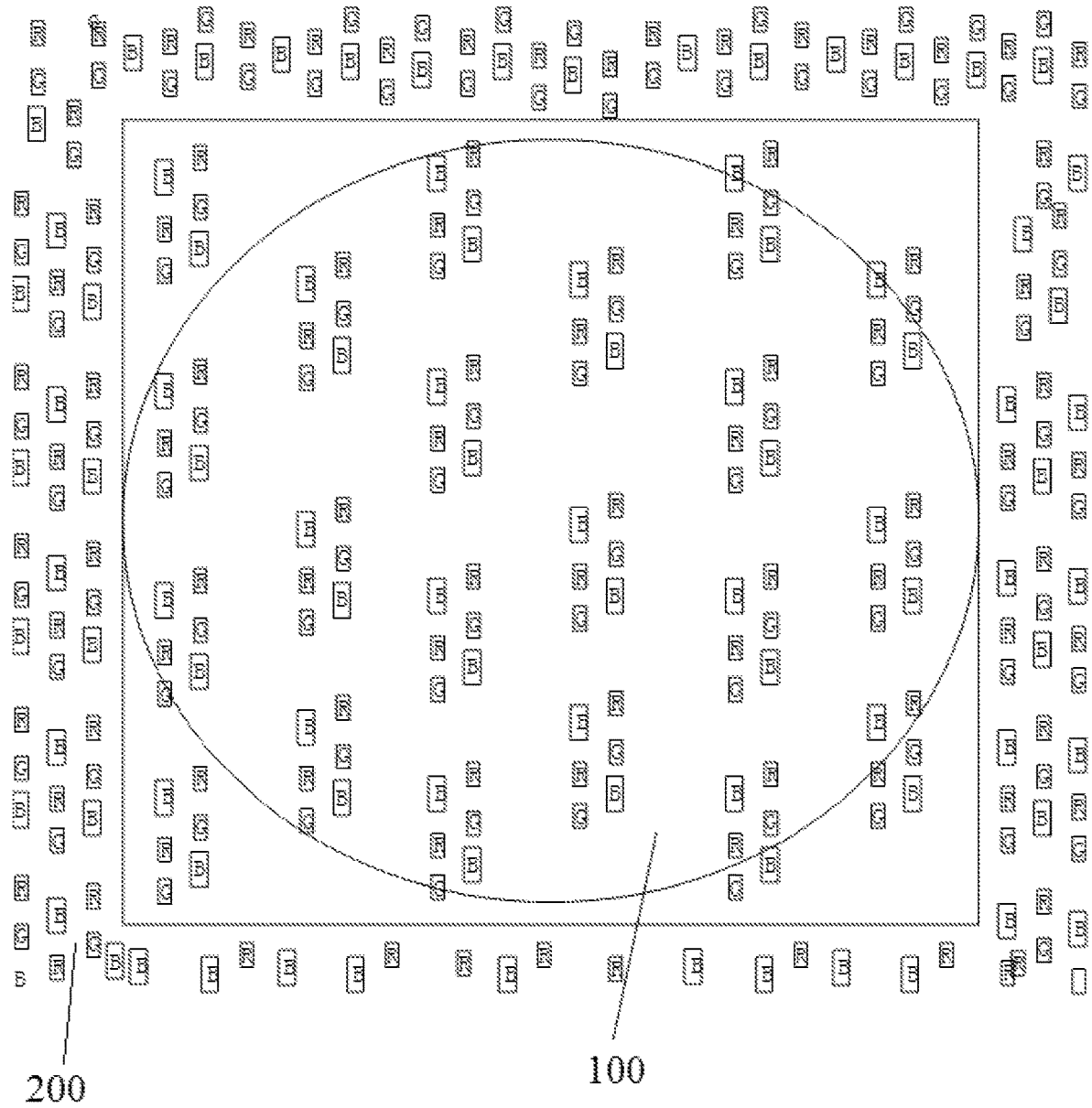
FIG. 6C is a structural schematic diagram of a first arrangement of sub-pixels of the display screen according to an embodiment of the present disclosure.

In the embodiment shown in FIGS. 6A, 6B, and 6C, the minimum repeating unit 110 in the first region 100 includes one pixel unit 111 and one first blank region 112, and the first blank region is capable of carrying one pixel unit. For example, the first sub-pixel, the second sub-pixel, and the third sub-pixel are a red sub-pixel (R), a green sub-pixel (G), and a blue sub-pixel (B), respectively. The pixel unit 111 is composed of six sub-pixels of two red sub-pixels, two green sub-pixels, and two blue sub-pixels. In general, the sub-pixels in the first region 100 are arranged as a plurality of identical column groups in the longitudinal direction, and each of the column groups includes a first column in the repeating form of a BRG unit (i.e., a blue sub-pixel (B), a red sub-pixel (R), and a green sub-pixels (G) alternate and repeat), and a second column in an RGB unit repeating form (i.e., a red sub-pixels (R), a green sub-pixels (G), and a blue sub-pixels (B) alternate and repeat); in the first column, the longitudinal distance between adjacent BRG units is greater than the longitudinal distance between sub-pixels within the BRG unit, in the second column, the longitudinal distance between adjacent RGB units is greater than the longitudinal distance between sub-pixels within the RGB unit, and the distance between adjacent column groups is greater than the distance between pixel columns within a column group.

As also shown in FIGS. 6A, 6B, and 6C, for the light-emitting units distributed in the second region, as a whole, the sub-pixels of the light-emitting units distributed in the second region 200 may be arranged in a manner that the first column of pixels are arranged in the GRB form, the second column pixels are arranged in the RBG form, and the blue sub-pixel B is shared by the adjacent red sub-pixel R and the green sub-pixel G.

Figure 7A:
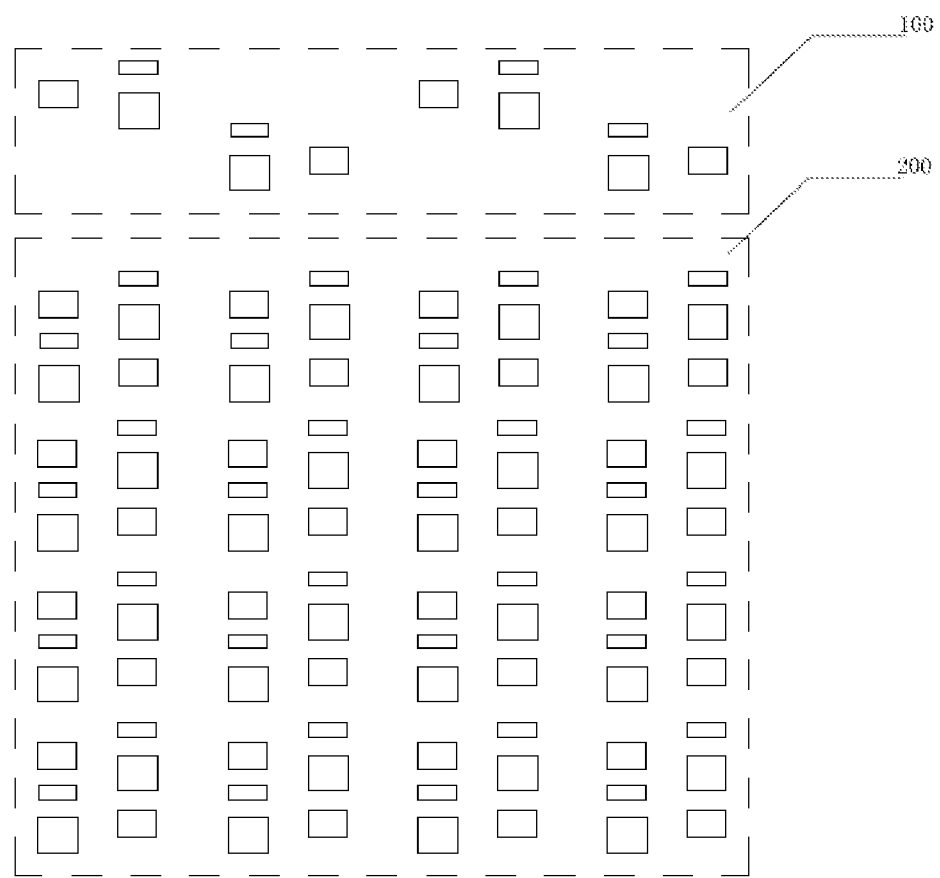
FIG. 7A is a structural schematic diagram of a second arrangement of sub-pixels of the display screen according to an embodiment of the present disclosure.
Figure 7B:
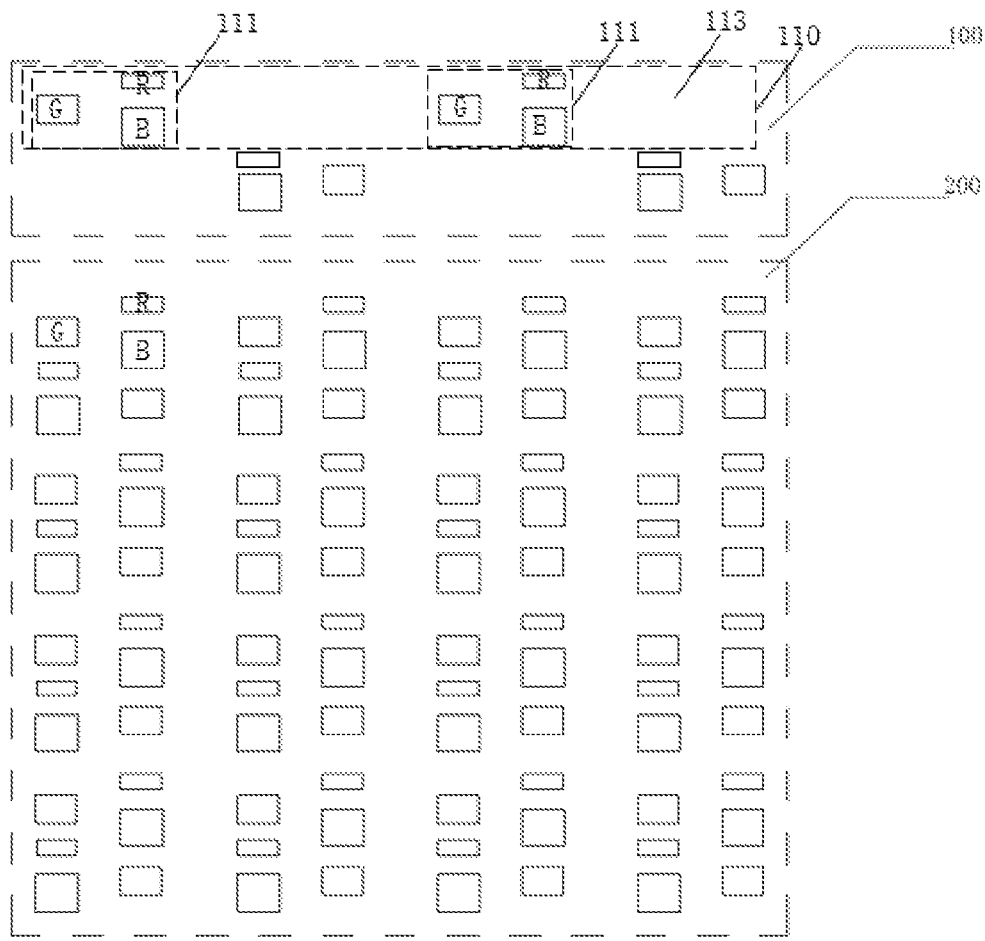
FIG. 7B is a structural schematic diagram of a second arrangement of sub-pixels of the display screen according to an embodiment of the present disclosure.
Figure 8A:
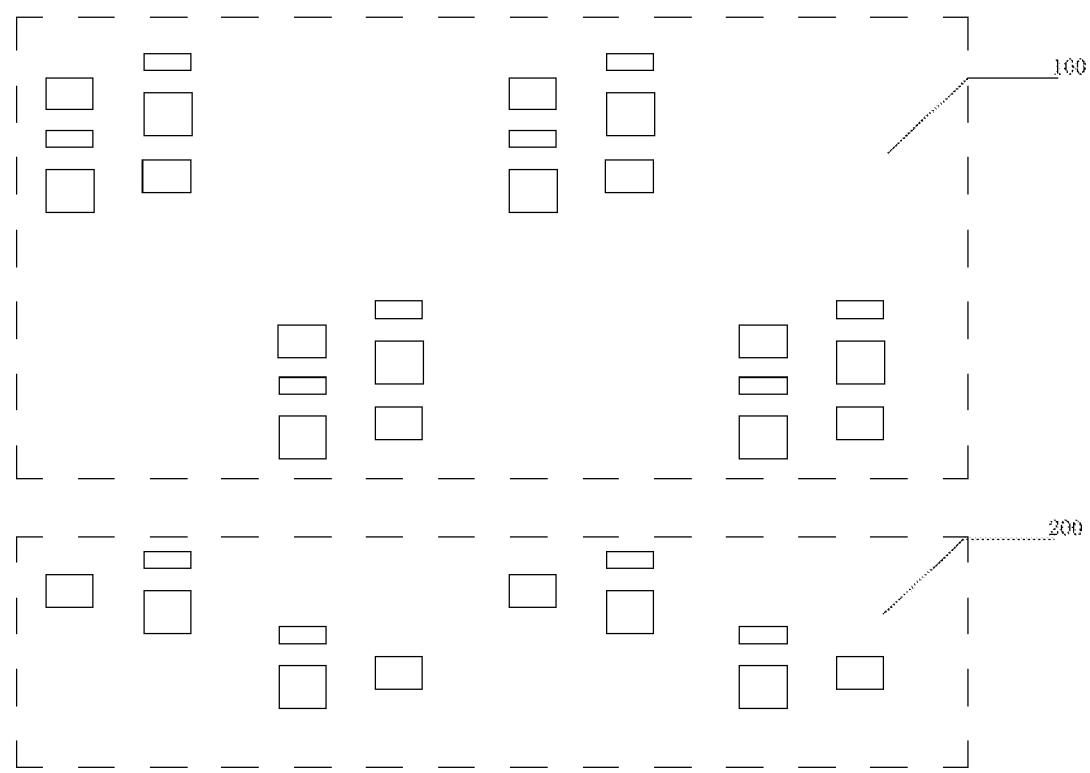
FIG. 8A is a structural schematic diagram of a third arrangement of sub-pixels of the display screen according to an embodiment of the present disclosure.
Figure 8B:
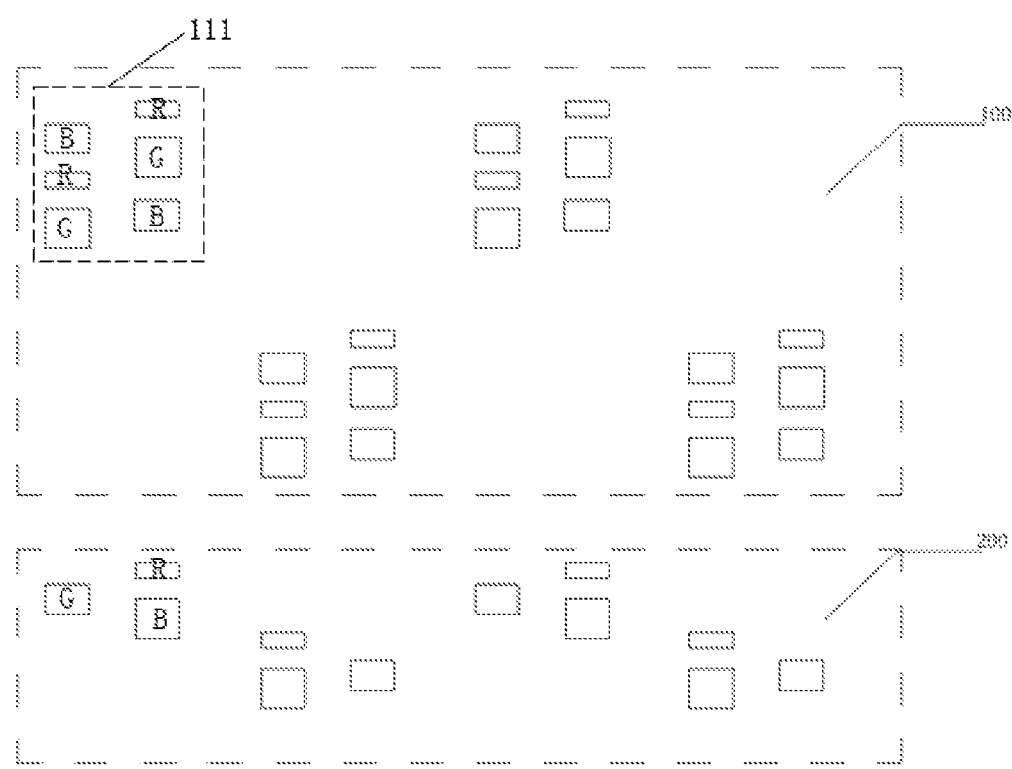
FIG. 8B is a structural schematic diagram of a third arrangement of sub-pixels of the display screen according to an embodiment of the present disclosure.

In the embodiment shown in FIGS. 7A and 7B, the minimum repeating unit 110 in the first region 100 includes two pixel units 111 and one second blank region 113 which can carry two pixel units. The pixel unit 111 is composed of three sub-pixels i.e., one red sub-pixel, one green sub-pixel, and one blue sub-pixel. The minimum repeating units distributed in two adjacent rows or columns are misaligned with each other so as to display uniformly and improve the display performance.

In an embodiment, the pixel unit in the first region 100 includes two red sub-pixels, two green sub-pixels, and two blue sub-pixels; the pixel unit in the second region 200 includes one red sub-pixel, one green sub-pixel, and one blue sub-pixel. In order to improve the light transmittance of the display screen, a blank region may be provided in both the first region 100 and the second region 200. Specifically, referring to FIGS. 8A and 8B, the pixel unit in the first region 100 is composed of six sub-pixels, i.e., two red sub-pixels, two green sub-pixels, and two blue sub-pixels, and the pixel unit in the second region 200 is composed of three sub-pixels, i.e., one red sub-pixel, one green sub-pixel, and one blue sub-pixel.

Referring to FIGS. 6A to 8, it can be understood that, due to the presence of the first blank region and/or the second blank region, the light emission of a pixel unit needs to cover the first blank region and/or the second blank region so as not to reduce the display brightness of the display screen.

In an embodiment provided herein, a method of driving a display screen is provided to solve a technical problem of a reduced display brightness of the display screen.

Figure 9:
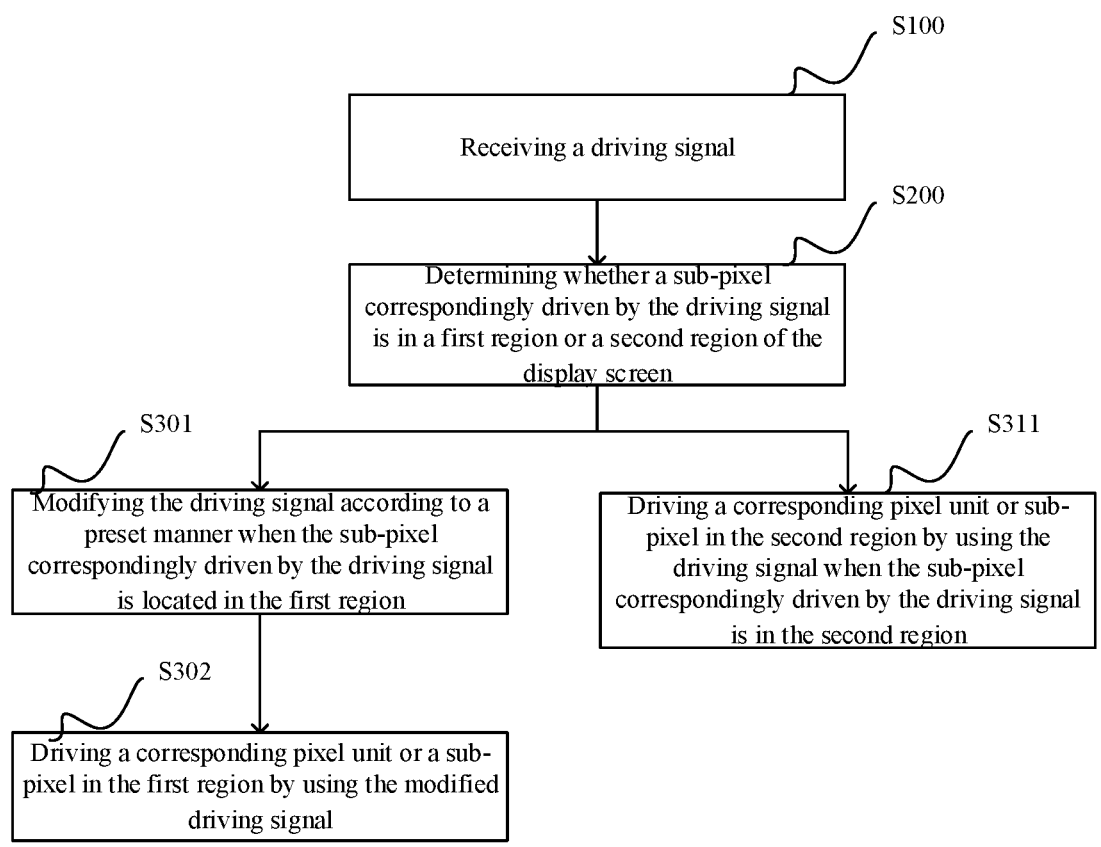
FIG. 9 is a flowchart of a method of driving a display screen according to an embodiment of the present disclosure.

Referring to FIG. 9, a method of driving a display screen includes:

in S100: receiving a driving signal;

in S200: determining whether a sub-pixel correspondingly driven by the driving signal is in a first region 100 or a second region 200 of the display screen, and the first region 100 has a physical pixel density smaller than that of the second region 200;

in S301: modifying the driving signal according to a preset manner when the sub-pixel correspondingly driven by the driving signal is located in the first region 100;

In S302: driving a corresponding pixel unit or a sub-pixel in the first region 100 by using the modified driving signal;

In S311: driving a corresponding pixel unit or sub-pixel in the second region 200 by using the driving signal when the sub-pixel correspondingly driven by the driving signal is in the second region 200.

Firstly, the driving signal is received. Then, the corresponding address information is looked up in the driving signal. Based on the address information, it is determined whether the pixel unit or the sub-pixel driven by the driving signal is in the first region 100 or the second region 200 (because the pixel unit is composed of a plurality of sub-pixels). When the pixel unit or the sub-pixel driven by the driving signal is in the first region 100, it indicates that the display brightness may be low if the region is displaying normally. When the pixel unit or the sub-pixel driven by the driving signal is in the second region 200, it indicates that the display brightness may be normal if the region is displaying normally, and no additional modification is required. Thus, when the pixel unit or sub-pixel correspondingly driven by the driving signal is in the first region 100, the driving signal is modified in a preset manner to generate a modified driving signal, and then, the pixel unit or the sub-pixel is driven to work by using the modified driving signal. When the pixel unit or sub-pixel correspondingly driven by the driving signal is in the second region 200, the driving signal will not be modified, and the corresponding pixel unit or sub-pixel is directly driven by using the driving signal.

Furthermore, in yet another embodiment provided herein, the driving signal is modified by an arithmetic average or weighted average.

Each sub-pixel and the first blank region and/or the second blank region can be driven in following manner: for the driving signal of the sub-pixel and the driving signal of the adjacent blank region in the specified direction, the driving signal of the blank region can be directly ignored, or parameters representing the brightness value or the gray scale value in the driving signal of the blank region can be superposed into the sub-pixel adjacent to the blank region so as to prevent the brightness from being decreased. The superposition may be in way of direct summation, or the arithmetic average after the summation or the weighted average according to a certain weight value is superposed. After the modification of the driving signal, the reduction of the display brightness due to the presence of the blank region can be alleviated to some extent.

The present disclosure also provides two driving algorithm, the first driving algorithm is 1:2 algorithm, and the other algorithm is a 3:4 algorithm. With respect to the 1:2 algorithm, referring to FIGS. 2A, 2B, and 3, the sub-pixels are shared in a form of a common side, and it can be seen that the two sub-pixels are default. Thus, the driving signals of the remaining sub-pixels are calculated in sets of two pixel units. For example, in FIG. 3, the driving signal of the default blue sub-pixel and the driving signal of the non-default blue sub-pixel are calculated, and after the modified driving signal is calculated according to the algorithm, the common blue sub-pixel is driven to work. The same is true for the common red sub-pixels and is omitted for brevity. Referring to FIGS. 4A, 4B, 4C, and 5 for the 3:4 driving algorithm, the sub-pixel is shared in the form of a common vertex, and it can be seen that one sub-pixel is default. Thus, the driving signals of the remaining sub-pixels are calculated in sets of 4 pixel units. For example, in FIG. 5, the driving signal of the default one red sub-pixel and the driving signal of the non-default red sub-pixel are calculated, the modified driving signal is calculated according to the algorithm, and then the common red sub-pixel is driven.

Figure 10:
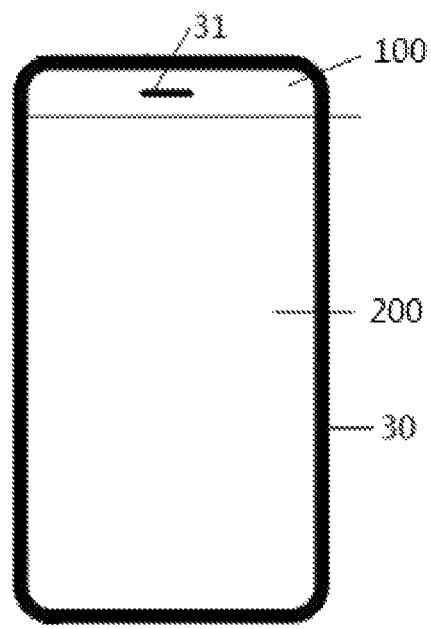
FIG. 10 is a structural schematic diagram of a display apparatus provided in the present disclosure.

Referring to FIG. 10, the present disclosure also provides a display apparatus including: a display screen 30 including a first region and a second region, the first region having a physical pixel density smaller than that of the second region; and an under-screen photosensitive module 31 capable of sensing light coming through a first region of the display screen.

Since the physical pixel density in the first region is smaller than the physical pixel density in the second region, the pixel unit includes a plurality of sub-pixels, and one sub-pixel is one physical pixel, the pixel unit density in the first region is smaller than the pixel unit density in the second region.

Details for the display screen 30, the first region 100, and the second region 200 are described in the preceding part and are omitted here for brevity.

The display apparatus herein can be understood as an individual product such as a mobile phone, a tablet computer etc. The display apparatus may also include a DC power supply, a DC power interface or an AC power interface, a memory, a processor etc.

The DC power supply herein may be a lithium battery in a specific application. The DC power or AC power interface may be a micro-USB plug-in interface in a specific application. The memory may be a flash memory chip. The processor may be a CPU, a single-chip computer and so on that has an arithmetic function.

In one specific application provided by the present disclosure, the under-screen photosensitive module 31 may be a front-facing camera or a photoelectric sensor. The photoelectric sensor may be, in particular, an infrared sensor for detecting whether a human face is close to the display screen.

In an embodiment provided herein, the under-screen photosensitive module is embedded in a depth ranging from 4 mm to 6 mm under the display screen. The inventor found that in the display screen, as the depth at which light travels gradually increases, the light intensity attenuates, and when the under-screen photosensitive module is embedded in a depth ranging from 4 mm to 6 mm under the display screen, both a stable assembly of the under-screen photosensitive module and a light intensity within the required range may be ensure.

In the embodiments provided herein, the display screen may be prepared by using AMOLED technology. A specific preparation method (which may be referred to as a method of manufacturing an organic light-emitting display apparatus in the embodiment) is as follows.

Figure 11:
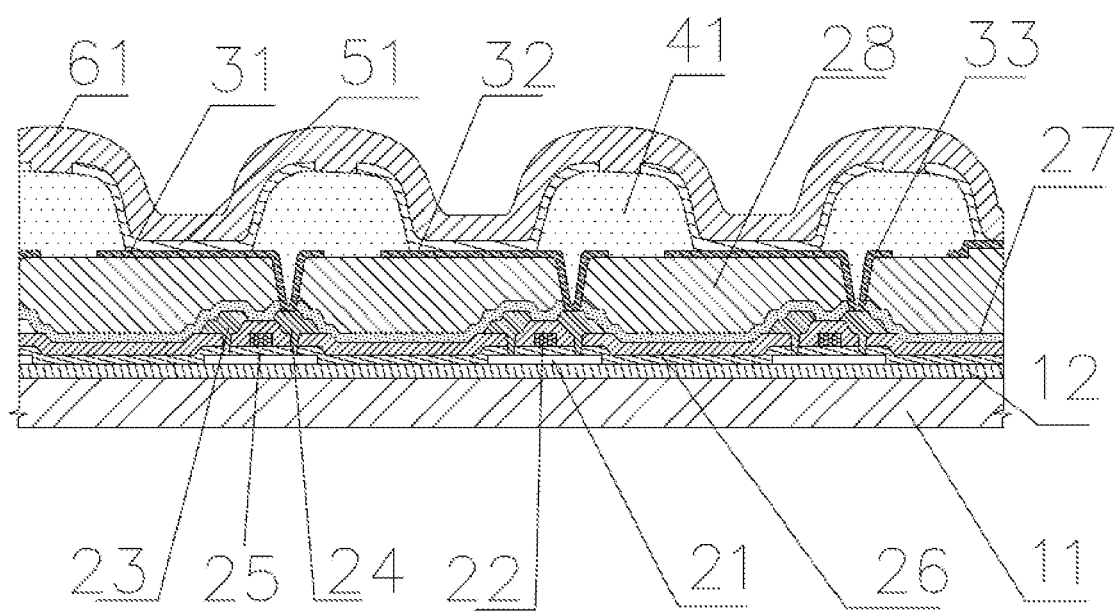
FIG. 11 is a schematic diagram of a layered structure of an organic light-emitting display apparatus according to an embodiment of the present disclosure.

Referring to FIG. 11, first, a substrate 11 is prepared. The substrate 11 has a first sub-pixel region, a second sub-pixel region, and a third sub-pixel region. A set of the first sub-pixel region, the second sub-pixel region, and the third sub-pixel region may constitute a pixel unit region. The substrate 11 may have a plurality of pixel unit regions. In an embodiment, the first sub-pixel region may be a sub-pixel region that emits red light; the second sub-pixel region may be a sub-pixel region that emits green light; and the third sub-pixel region may be a sub-pixel region that emits blue light.

The substrate 11 may be formed of a suitable material such as a glass material, a metal material, or a plastic material including polyethylene terephthalate (PET), polyethylene naphthalate (PEN), polyimide and the like. A thin-film transistor (TFT) may be formed on the substrate 11. In an embodiment, prior to forming the TFT, an additional layer, such as a buffer layer 12, may be formed on the substrate 11. The buffer layer 12 may be formed on the entire surface of the substrate 11 or may be formed by patterning. The buffer layer 12 may be a layered structure formed from a suitable material including PET, PEN, polyacrylate and/or polyimide, or the like, in the form of a single layer or multi-layered stack. The buffer layer 12 may also be formed of silicon oxide or silicon nitride, or may include a composite layer of organic material and/or an inorganic material.

The TFT array may control the emission of each sub-pixel, or may control the volume of emission when each sub-pixel emits light. Each TFT in the TFT array may include a semiconductor layer 21, a gate electrode 22, a source electrode 23, and a drain electrode 24.

The semiconductor layer 21 may be formed of an amorphous silicon layer, a silicon oxide layer, a metal oxide, or a polysilicon layer, or may be formed of an organic semiconductor material. In an embodiment, the semiconductor layer 21 includes a channel region, and source and drain regions doped with dopants. The semiconductor layer 21 may be covered with a gate insulating layer 25. The gate electrode 22 may be disposed on the gate insulating layer 25. In an embodiment, the gate insulating layer 25 may be formed by patterning. The gate insulating layer 25 may be formed of silicon oxide, silicon nitride, or other insulating organic or inorganic material in consideration of adhesion with an adjacent layer, formability of a target stack layer, and surface flatness. The gate electrode 22 may be covered by an interlayer insulating layer 26 formed of silicon oxide, silicon nitride, and/or other suitable insulating organic or inorganic material. A portion of the gate insulating layer 25 and the interlayer insulating layer 26 may be removed, and a contact hole is formed after the removal to expose a predetermined region of the semiconductor layer 21. The source electrode 23 and the drain electrode 24 may contact the semiconductor layer 21 via the contact hole. The source electrode 23 and the drain electrode 24 may be formed by a single-material layer or composite-material layer of at least one material of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu) and other suitable alloys.

A protective layer 27 formed of silicon oxide, silicon nitride, and/or other suitable organic or inorganic insulating material may cover the TFT. The protective layer 27 covers all or a portion of the substrate 11. Since a TFT having a complex layer structure is disposed under the protective layer 27, the top surface of the protective layer 27 may be not flat sufficiently. Therefore, it is necessary to form a planarization layer 28 on the protective layer 27 so as to form a sufficiently flat top surface.

After the planarization layer 28 is formed, a via hole may be formed in the protective layer 27 and the planarization layer 28 to expose the source electrode 23 and the drain electrode 24 of the TFT.

Then, a first sub-pixel electrode 31, a second sub-pixel electrode 32, and a third sub-pixel electrode 33 are formed on the planarization layer 28. The first sub-pixel electrode 31 is formed in the first sub-pixel region, the second sub-pixel electrode 32 is formed in the second sub-pixel region, and the third sub-pixel electrode 33 is formed in the third sub-pixel region. Here, the first sub-pixel electrode 31, the second sub-pixel electrode 32, and the third sub-pixel electrode 33 may be simultaneously or synchronously formed. Each of the first sub-pixel electrode 31, the second sub-pixel electrode 32, and the third sub-pixel electrode 33 may be electrically connected to the TFT through the via hole. Here, the first sub-pixel electrode 31, the second sub-pixel electrode 32, and the third sub-pixel electrode 33 are generally referred to as an anode.

Each of the first sub-pixel electrode 31, the second sub-pixel electrode 32, and the third sub-pixel electrode 33 may form a transparent electrode (transflective type) or a reflective electrode. The transparent electrode (transflective type) electrode, when is formed by the first sub-pixel electrode 31, the second sub-pixel electrode 32, and the third sub-pixel electrode 33, may be formed of indium tin oxide (ITO), indium zinc oxide (IZO), zinc oxide (ZnO), indium oxide ($In_2O_3$), indium gallium oxide (IGO), or aluminum zinc oxide (AZO).

when the reflective electrode is formed by the first sub-pixel electrode 31, the second sub-pixel electrode 32, and the third sub-pixel electrode 33, a reflective layer is made of silver (Ag), magnesium (Mg), aluminum (Al), platinum (Pt), palladium (Pd), gold (Au), Nickel (Ni), neodymium (Nd), iridium (Ir), chromium (Cr), or any mixture thereof, and an auxiliary layer is made of transparent electrode material, such as indium tin oxide (ITO), indium zinc oxide (IZO), zinc oxide (ZnO), indium oxide ($In_2O_3$) and the like. The reflective electrode layer is formed by stacking of the reflective layer and the auxiliary layer. The structures and materials of the first sub-pixel electrode 31, the second sub-pixel electrode 32, and the third sub-pixel electrode 33 are not limited thereto.

After the first sub-pixel electrode 31, the second sub-pixel electrode 32, and the third sub-pixel electrode 33 are formed, as shown in FIG. 11, a pixel defining layer 41 (PDL) may be formed. The PDL may be configured to define a sub-pixel by providing an opening corresponding to each sub-pixel, i.e., an opening exposing a central portion of each sub-pixel.

The PDL may be formed of a single-material layer or composite-material layer of a suitable organic material such as polyacrylate, polyimide and the like or a suitable inorganic material.

The PDL may be formed in such a manner that a layer for PDL is formed on the entire surface of the substrate 11 by using a material suitable for PDL, to cover the first sub-pixel electrode 31, the second sub-pixel electrode 32, and the third sub-pixel electrode 33. Then, the PDL layer will be patterned to expose the central portions of the first sub-pixel electrode 31, the second sub-pixel electrode 32, and the third sub-pixel electrode 33.

The light-emitting layer 51 may be formed by vapor-deposition of a light-emitting material. The vapor-deposition material covers at least a part of the first sub-pixel electrode 31 that is not covered by the PDL layer, covers at least a part of the second sub-pixel electrode 32 that is not covered by the PDL layer, and covers at least a part of the third sub-pixel electrode 33 that is not covered by the PDL layer. A precision metal mask can be used to vapor-deposit light-emitting materials that emit red, green, and blue light.

Then, a counter electrode 61 covering the first sub-pixel region, the second sub-pixel region, and the third sub-pixel region is formed by vapor-deposition. The counter electrode 61 may be integrally formed with respect to a plurality of sub-pixels so as to cover the entire display region. The counter electrode 61 is commonly referred to as a cathode.

The counter electrode 61 contacts the electrode power supply line outside the display region so that the electrode power supply line can receive an electric signal. The counter electrode 61 may form a transparent electrode or a reflective electrode. When the counter electrode 61 forms a transparent electrode, the counter electrode 61 may include a layer by depositing Li, Ca, LiF/Ca, LiF/Al, Al, Mg or a mixed material of any of these materials, and an auxiliary electrode or bus electrode line formed of a transparent (transflective) material including ITO, IZO, ZnO, or $In_2O_3$ in a direction toward the light-emitting layer. The counter electrode 61, when is formed as a reflective electrode, may have a layer including one or more materials selected from Li, Ca, LiF/Ca, LiF/Al, Al, Ag, and Mg. However, the configuration and material of the counter electrode 61 are not limited thereto, and thus may be changed.

Each of technical features of the above-described embodiments may be combined arbitrarily. To simplify the description, not all of possible combinations of each of the technical features in the above embodiments are described. However, all of the combinations of these technical features should be considered as within the scope of the present specification, as long as such combinations do not contradict with each other.

The above embodiments merely illustrate several embodiments of the present application, and the description thereof is specific and detailed, but it shall not be constructed as limiting the scope of the present application. It should be noted that, for a person of ordinary skill in the art, several variations and improvements may be made without departing from the concept of the present application, and these are all within the protection scope of the present application. Therefore, the protection scope of the present application shall be subject to the appended claims.

The invention claimed is:

1. A display screen comprises a first region and a second region, wherein:
    the first region is configured as an auxiliary display region and characterized by a first color pixel pattern;
    the second region is configured as a main display region and characterized by a second color pixel pattern;
    the first region has a physical pixel density smaller than that of the second region;
    the first region is distributed with second-type light-emitting units; and the second-type light-emitting units are distributed in a shape of a pair of triangles having a common vertex;
    the second-type light-emitting unit includes one of the first sub-pixel, two of the second sub-pixels, two of the third sub-pixel, in the second-type light-emitting unit, the first sub-pixel is a red sub-pixel, the second sub-pixel is a green sub-pixel, the third sub-pixel is a blue sub-pixel, the one red sub-pixel is located at the common vertex of the pair of triangles, and the two green sub-pixels and the two blue sub-pixels are respectively located at remaining vertices of the pair of triangles, the respective vertices of each of the triangles demonstrates different sub-pixels; and
    with respect to the sub-pixels arranged in the first region, in a lateral direction, the blue sub-pixels are arranged in a plurality of row groups, each of the plurality of row groups has two rows between a row of red sub-pixel and a row of green sub-pixels, and a distance between the adjacent row groups is greater than a distance between the row of red sub-pixels and the row of green sub-pixels; and in a longitudinal direction, a plurality of identical column groups are arranged, each of the plurality of column groups comprises a first column in GBGB form, a second column in BRBR form, and a third column being distributed with only green sub-pixels, and a distance between the adjacent column groups is greater than a distance between pixel columns within one of the plurality of column group.

2. The display screen according to claim 1, wherein the first region has a light-emitting unit different from a light-emitting unit of the second region;
    the light-emitting unit in the first region comprises at least a first sub-pixel, at least a second sub-pixel, and at least a third sub-pixel; a number of at least one sub-pixel of the first sub-pixel, the second sub-pixel, and the third sub-pixel is different from the numbers of the other two sub-pixels.

3. The display screen according to claim 2, wherein the first region has a first plurality of light-emitting units; and the second region has a second plurality of light-emitting units.

4. The display screen according to claim 3, wherein the first region is distributed with a plurality of first-type light-emitting units; and the first-type light-emitting units are arranged in a shape of a pair of triangles sharing a common side.

5. The display screen according to claim 2, wherein the light-emitting unit distributed in the second region comprises a red sub-pixel, a green sub-pixel, and a blue sub-pixel.

6. The display screen according to claim 1, wherein the first region has a pixel unit density smaller than that of the second region.

7. The display screen according to claim 6, wherein the first region has minimum repeating units comprising one pixel unit and one first blank region, and the first blank region is capable of carrying one pixel unit.

8. The display screen according to claim 6, wherein the first region has minimum repeating units comprising two pixel units and one second blank region, and the second blank region is capable of carrying two pixel units.

9. The display screen according to claim 7, wherein the minimum repeating units distributed in two adjacent rows or columns are misaligned with each other.

10. The display screen according to claim 7, wherein:
the pixel unit in the first region comprises two red sub-pixels, two green sub-pixels, and two blue sub-pixels, as a whole, in a longitudinal direction, the sub-pixels in the first region are arranged as a plurality of identical column groups, each of the plurality of column groups comprises a first column in a BRG unit repeating form and a second column in an RGB unit repeating form, a longitudinal distance between adjacent BRG units in the first column is greater than a longitudinal distance between the sub-pixels within the BRG unit, a longitudinal distance between adjacent RGB units in the second column is greater than a longitudinal distance between the sub-pixels within the RGB units, and a distance between adjacent column groups is greater than a distance between pixel columns within one of the plurality of column group; and
the pixel unit in the second region comprises one red sub-pixel, one green sub-pixel, and one blue sub-pixel.

11. A method of driving a display screen, comprising:
receiving a driving signal;
determining whether a sub-pixel correspondingly driven by the driving signal is in a first region or a second region of the display screen, wherein the first region has a physical pixel density smaller than that of the second region;
modifying the driving signal according to a preset manner when the sub-pixel correspondingly driven by the driving signal is in the first region;
driving a corresponding sub-pixel in the first region by using a modified driving signal; and
driving a corresponding sub-pixel in the second region by using the driving signal when the sub-pixel correspondingly driven by the driving signal is in the second region.

12. The method according to claim 11, wherein the driving signal is modified by an arithmetic average or a weighted average.

* * * * *